232-101 CROSS REFERENCE

United States Patent Office 2,809,103

Patented Oct. 8, 1957

2,809,103

FABRICATION OF SEMICONDUCTOR ELEMENTS

Ben H. Alexander, Waltham, Mass., assignor to Sylvania Electric Products Inc., a corporation of Massachusetts No Drawing. Application November 10, 1953, Serial No. 391,369

4 Claims. (Cl. 41—42)

The present invention relates to the manufacture of semiconductor translating and transducing devices of the type including a germanium crystal, and in particular to etching methods for preparing such devices. The invention finds special application in the fabrication of transistors, particularly in junction type transistors.

Germanium employed in the manufacture of semiconductor devices, is usually taken from a large crystal or an ingot of semiconductive germanium and is cut as with a diamond wheel into slices and further subdivided into sizes suitable for use in such devices. The best characteristics of germanium translators employing rectifying point contacts or rectifying junctions requires chemical etching to remove the mechanically worked surface left by the cutting or abrasion involved in the preparation of the individual germanium wafers for such devices. Numerous etchants have been used for removing the abraded surface layers from germanium, such as an aqueous solution of hydrofluoric and nitric acids, and an aqueous solution of hydrofluoric acid and hydrogen peroxide.

An object of the present invention is to provide a new method for etching germanium that is generally useful in the manufacture of semiconductive devices of germanium; and it has been found to have certain definite advantages over known methods of etching germanium heretofore. These advantages are especially notable in the manufacture of junction transistors. While the invention is generally useful for etching germanium for general application, its advantages are best illustrated in connection with the manufacture of junction transistors, especially alloy junction transistors.

Germanium alloy-junction transistors are usually made with etched germanium wafers taken from a large single crystal. The crystal is highly purified germanium containing a controlling impurity to impart semiconductor properties such as the desired resistivity and conductivity type, N or P. For example, opposed junctions may be formed by using tiny balls or discs of indium or an indium alloy that are applied and alloyed in a furnace treatment to opposite sides of an N-type germanium wafer in making a P–N–P transistor. The furnace treatment causes the formation of P-type layers on opposite sides of the N-type germanium wafer. If this treatment is carried on at too high a temperature, both alloys may meet as a short circuit. If the germanium specimen is thick the alloying treatment must be performed at a higher temperature if the junctions are to be sufficiently close to each other (approximately .001 inch) to realize the electrical characteristics usually desired. In order to produce junctions close enough, yet not touching, involves a critical furnace treatment, as is apparent. Furthermore since it is desirable to treat large numbers of wafers in one operation, it is important that all the wafers be equal in thickness at the start of this treatment.

It is also important that the surface of the wafers be as smooth as possible, for uneveness in the surface results in uneveness in the alloyed junction that is formed in the furnace treatment. This condition impairs the electrical characteristics of the finished transistors.

To minimize the foregoing difficulties it has been proposed to start the furnace treatment with germanium wafers of the proper thickness and as uniform as practically possible. Slices taken from the large germanium crystal are in practice from .010 to .020 inch in thickness. This thickness of the slice may be reduced to a prescribed figure such as 0.005, as by lapping and by chemical etching. The thin slices are divided into large numbers of individual wafers, typically 0.1 inch by 0.2 inch. Because of the variable thickness resulting when known lapping and etching treatments are used it has been necessary to sort the desired wafers from the others as this stage by tedious, meticulous measurement of the thickness of each of the wafers, returning the excessively thick ones for further etching and rejecting those thinner than prescribed. Careful observation of the wafers passed by this sorting process shows that they are frequently nonuniform in thickness, departing from the prescribed thickness for which the alloying furnace treatment is standardized. Furthermore the presently used aqueous etchants such as mixtures of hydrofluoric acid and nitric acid in water tend to produce surface irregularities which are undesirable.

The present invention provides a new and useful process for etching germanium which has been found susceptible of superior control, in respect to the extent of attack into the germanium and in respect to uniformity over the surface exposed to the treatment, in comparison to known aqueous etchants for germanium. In accordance with the present invention molten sodium hydroxide is employed in etching crystalline germanium. The molten alkali facilitates uniform attack on the germanium for even, uniform removal of material over the surface area and at a readily controlled rate of attack into the bulk. The resulting specimen has a minimum of surface rugosity and, after removal of a film, results in a highly polished substantially flat etched surface.

It is not essential in the broad application of the invention that the specimen should be actually immersed in molten sodium hydroxide; for sodium hydroxide can be used to remove material locally, as by depositing a droplet of sodium hydroxide on a germanium wafer, for forming a tiny well in the germanium as is required in certain forms of translators.

The rate dissolution of the germanium crystal by the molten sodium hydroxide etchant can be controlled accurately over a wide range by selection of the temperature of the molten sodium hydroxide. The melting point for sodium hyrdoxide is approximately 320° C., a practical working range of temperatures being found between 350° C. and 550° C. At 350° C. the etching rate has been observed at less than one-tenth of a mill per minute, the etching rate increasing with increased temperatures to approximately 5 mills per minute at 550° C. At temperatures higher than 550° C. the reaction between the molten attacking reagent and the germanium becomes violent, making control of the process quite difficult. The germanium is removed from the molten sodium hydroxide after a period of time predetermined in accordance with the required extent of attack. After cooling, the solidified sodium hydroxide may be removed as by washing in water. A dark film remains on the germanium that is presumed to be an oxide or germinate. The dark film is not readily soluble in water, or nitric acid, or hydrochloric acid, but can be removed readily by a brief treatment with an aqueous etchant for germanium, especially an aqueous solution of hydrogen peroxide and hydrofluoric acid, or an aqueous solution of hydrofluoric acid and nitric acid, both these solutions being recognized as germanium etchants. Thereafter the etched germanium is washed, dried and, in the case of thin wafers, it may be checked for dimensional accuracy. The etched germanium is then in condition for fabrication of junction transistors, including alloy junction transistors; and for other semiconductor devices such as point contact rectifiers and point contact transistors. While the invention has special application in the fabrication of junction transistors, it will be recognized as having varied application and accordingly the appended claims should be construed broadly, as is consistent with the spirit and scope of the invention.

What is claimed is:

1. The method of preparing a germanium crystal for incorporation into a semiconductor device including the steps of successively etching the crystal in molten sodium hydroxide and treating the etched crystal with an aqueous etchant for germanium.

2. The process of preparing a body of germanium for use in a semiconductor translator including the steps of etching said body with sodium hydroxide at a temperature between 320° C. and 550° C., and then treating the etched body with an aqueous solution of hydrofluoric acid and nitric acid.

3. In the manufacture of junction-type transistors, the steps of reducing the thickness of a germanium wafer by treating the wafer with molten sodium hydroxide, and etching the thus treated wafer with an aqueous solution of hydrogen peroxide and hydrofluoric acid to remove surface films formed incident to the treatment with sodium hydroxide.

4. In the manufacture of semiconductor devices, having a wafer of crystalline germanium, the steps including reducing the thickness of said wafer at a controlled rate by subjecting said wafer to molten sodium hydroxide at a selected temperature between 320° C. and 550° C., and surface treating the reduced wafer with an aqueous solution of hydrogen peroxide and hydrofluoric acid.

References Cited in the file of this patent

UNITED STATES PATENTS

| | | |
|---|---|---|
| 2,395,694 | Spence et al. | Feb. 26, 1946 |
| 2,542,727 | Theurer | Feb. 20, 1951 |
| 2,588,008 | Jones et al. | Mar. 4, 1952 |

OTHER REFERENCES

Hampel: Rare Metals Handbook, Rheinhold Publg. Co., 1954, New York, N. Y. Bottom of page 165.

Thorpe's Dictionary of Applied Chemistry, 4th ed., vol. V, 1941. Publ. by Longmans Green & Company, New York, N. Y. 521, col. 1.